(12) United States Patent
Wang et al.

(10) Patent No.: US 10,103,743 B1
(45) Date of Patent: Oct. 16, 2018

(54) ANALOG-TO-DIGITAL CONVERTER AND CONTROL METHOD THEREOF

(71) Applicants: Luke Wang, Burlington (CA); Anthony Chan Carusone, Burlington (CA); Marc-Andre Lacroix, Carp (CA)

(72) Inventors: Luke Wang, Burlington (CA); Anthony Chan Carusone, Burlington (CA); Marc-Andre Lacroix, Carp (CA)

(73) Assignees: HUAWEI TECHNOLOGIES CANADA CO., LTD., Kanata (CA); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 15/808,095

(22) Filed: Nov. 9, 2017

(51) Int. Cl.
| | |
|---|---|
| *H03M 3/00* | (2006.01) |
| *H03M 1/16* | (2006.01) |
| *H03M 1/12* | (2006.01) |
| *H03M 1/08* | (2006.01) |
| *H03H 17/02* | (2006.01) |

(52) U.S. Cl.
CPC ........ *H03M 1/165* (2013.01); *H03H 17/0248* (2013.01); *H03M 1/08* (2013.01); *H03M 1/1215* (2013.01); *H03M 3/414* (2013.01); *H03M 3/458* (2013.01)

(58) Field of Classification Search
CPC . H04L 7/033; H04L 25/03057; H04L 7/0062; H04L 7/0334; H03M 1/165; H03M 3/414; H03M 3/458; H03M 1/1215; H03M 1/08; H03H 17/0248
USPC ......... 341/118, 143, 155, 159; 375/233, 355
See application file for complete search history.

(56) References Cited

U.S. PATENT DOCUMENTS

| | | | | |
|---|---|---|---|---|
| 6,980,140 B1* | 12/2005 | Rowland | ............. | H03M 1/0809 341/118 |
| 7,262,724 B2* | 8/2007 | Hughes | ................. | H03M 1/181 341/118 |
| 8,300,685 B2* | 10/2012 | Chen | ................. | H04L 25/03057 360/46 |
| 8,462,037 B2 | 6/2013 | Singer et al. | | |
| 8,837,626 B2* | 9/2014 | Malipatil | ............ | H04L 25/0307 375/233 |

(Continued)

OTHER PUBLICATIONS

Zang et al., A 195mW/55mW Dual-Path Receiver AFE for Multistandard 8.5-to-11.5Gbis Serial Links in 40nm CMOS, 2013 IEEE International Solid State Circuits Conference, Feb. 18, 2013, pp. 34, 35 and Paper Continuations.

(Continued)

*Primary Examiner* — Khai M Nguyen
(74) *Attorney, Agent, or Firm* — BCF LLP

(57) ABSTRACT

The present disclosure relates to an analog-to-digital converter (ADC) and a method for controlling an ADC. The ADC includes a plurality of quantization levels for analog-to-digital conversion. The ADC is adapted for utilizing a subset of the plurality of quantization levels for analog-to-digital signal conversion. The subset is formed by selecting at least one level to be deactivated using a greedy search method and deactivating the at least one level. The method includes using a subset of the plurality of quantization levels for analog-to-digital signal conversion, the subset being formed by selecting at least one level to be deactivated using a greedy search method and deactivating the at least one level.

20 Claims, 13 Drawing Sheets

(56) References Cited

U.S. PATENT DOCUMENTS 8,929,497 B2 * 1/2015 Chmelar .......... H04L 25/03057
375/355
9,537,682 B2 * 1/2017 Venkatram .............. H04L 7/033

OTHER PUBLICATIONS

Tabasy et al., A 6b 10GS/s TI-SAR ADC with Embedded 2-Tap FFE/1-Tap DFE in 65nm CMOS, 2013 Symposium on VLSI Circuits Digest of Technical Papers, Kyoto, Japan, 2013.

Varzaghani et al., A 6-GSamples/s Multi-Level Decision Feedback Equalizer Embedded in a 4-Bit Time-Interleaved Pipeline A/D Converter, IEEE Journal of Solid State Circuits, Apr. 2016, pp. 935-944, vol. 41, No. 4.

Kim et al., Equalizer Design and Performance Trade-Offs in ADC-Based Serial Links, IEEE Transactions on Circuits and Systems-I: Regular Papers, Sep. 2011, pp. 2096-2107, vol. 58, No. 9.

Chen et al., Power Optimized ADC-Based Serial Link Receiver, IEEE Journal of Solid-State Circuits, Apr. 2012, pp. 938-951, vol. 47, No. 4.

Narasimha et al., BER-Optimal Analog-to-Digital Converters for Communication Links, IEEE Transactions on Signal Processing, Jul. 2012, pp. 3683-3691, vol. 60, No. 7.

Lin et al., A Study of BER-Optimal ADC-Based Receiver for Serial Links, IEEE Transactions on Circuits and Systems-I: Regular Papers, May 2016, pp. 693-704, vol. 63, No. 5.

Hossain et al., A 35 mW 10 Gb/s ADC-DSP less Direct Digital Sequence Detector and Equalizer in 65nm CMOS, in IEEE Symposium on VLSI Circuits, 2016, Honolulu, HI, USA.

Aurangozeb et al., Channel Adaptive ADC and TDC for 28 Gb/s PAM-4 Digital receiver, in IEEE Custom Integrated Circuits Conference (CICC), 2017, Austin, TX, USA.

Duan et al., A 12.8 GS/s Time-Interleaved ADC With 25 GHz Effective Resolution Bandwidth and 4.6 ENOB, IEEE Journal of Solid State Circuits, Aug. 2014, pp. 1725-1738, vol. 49, No. 8.

* cited by examiner

ANALOG-TO-DIGITAL CONVERTER AND CONTROL METHOD THEREOF

TECHNICAL FIELD

The present disclosure relates generally to the field of signal processing and in particular to an analog-to-digital converter and a method for controlling an analog-to-digital converter.

BACKGROUND

Standards such as 10GBASE-T, 40 GbE, and 100 GbE require communication links to function at multi-gigabits-per-second (Gb/s) data rates. As the data rate increases, the communication channel, such as coaxial or optical fiber cables, begin to impact the information quality. For example, inter-symbol interference (ISI) introduced by the channel must be corrected through equalization and/or forward error correction (FEC).

Digital circuit solutions for receivers have become more attractive for equalization and error correction due to the ease of abstraction in the design of digital signal processing (DSP). In order to implement digital signal processing on an analog wireline communication system, these digital solutions include an analog-to-digital converter (ADC). The ADC takes samples of the received analog signal and uses the samples to produce a digital signal, which can then be processed by the digital signal processing.

Receivers utilizing an ADC can introduce several additional disadvantages, however. Compared to analog or mixed-signal receivers, ADC-based receivers generally consume more power. ADC-based receivers are thus often reserved for applications where the signal degradation merits the additional cost, and often only used for medium reach communication channels (MR, 20 dB+ loss at one-half of the communication symbol rate) and long reach communication channels (LR, 30 dB+ loss) applications.

SUMMARY

It is an object of the present technology to ameliorate at least some of the inconveniences present in receiving systems generally and ADC-based receivers in particular.

Generally stated, the present technology provides an analog-to-digital converter and a method for controlling an analog-to-digital converter for an ADC-based receiver solution, where the ADC-based receiver can receive signals from short reach, medium reach, and long reach communication channels, while allowing power usage in the receiver to be scaled with channel loss. This solution is provided by the use of a greedy search method to select quantization levels to be deactivated or removed, such that a single ADC-based receiver can be used with low channel loss signals at lower power consumption while also being usable with high channel loss signals.

According to one aspect of the present technology, there is provided an analog-to-digital converter (ADC) for digitizing a received waveform for a digital communication link. The ADC includes at least one converter communicatively connected to at least one link, the at least one converter comprising a plurality of quantization levels, the at least one converter being adapted for utilizing a subset of the plurality of quantization levels for analog-to-digital signal conversion. The subset is formed by selecting at least one level of the plurality of quantization levels to be deactivated, the at least one level being selected using a greedy search method based on at least one performance metric; and deactivating the at least one level.

In some implementations of the present technology, the ADC includes at least one time interleaver; and the at least one converter module comprises a plurality of time interleaved converter modules operatively connected to the at least one time interleaver. In such cases, the subset is formed independently within each one of the converter modules, and all following descriptions may be apply independently to each converter module.

In some implementations of the present technology, the ADC is a full-flash ADC; the plurality of quantization levels are applied using a plurality of comparators; and the deactivating the at least one level is performed by turning off a corresponding one of the plurality of comparators. This may be done so that turning off comparators results in a reduction in the power consumption of the ADC.

In some implementations of the present technology, the ADC includes a 1-bit folding stage followed by an (n−1)-bit comparator array comprising a plurality of comparators, the plurality of comparators adapted for applying the plurality of quantization levels to the at least one signal, each one of the converter modules being adapted for utilizing a subset of the plurality of comparators corresponding to the subset of the plurality of quantization levels.

In some implementations of the present technology, each one of the converter modules is controllable such that a different subset of the plurality of comparators can be formed for each one of the plurality of converter modules.

In some implementations of the present technology, each one of the converter modules further includes a 2-tap forward feed equalizer connected between the at least one time interleaver and the 1-bit folding stage.

In some implementations of the present technology, the at least one converter is adapted to receive signals from any one of a short reach (SR) link, a medium reach (MR) link, and a long reach (LR) link.

In some implementations of the present technology, at least one continuous time linear equalization (CTLE) filter is connected between the at least one link and the ADC.

According to another aspect of the present technology, there is provided a method for controlling an analog-to-digital converter (ADC), the ADC having a plurality of quantization levels. The method includes using a subset of the plurality of quantization levels for analog-to-digital signal conversion. The subset is formed by selecting at least one level of the plurality of quantization levels to be deactivated, the at least one level being selected using a greedy search method based on at least one performance metric; and deactivating the at least one level.

In some implementations of the present technology, the deactivating the at least one level is deactivating a first level. The subset is further formed by selecting a second level of the plurality of quantization levels to be deactivated, the second level being selected using the greedy search method based on the at least one performance metric, and deactivating the second level, the first level remaining deactivated.

In some implementations of the present technology, the subset is further formed by successively selecting additional levels of the plurality of quantization levels to be deactivated using the greedy search method based on the at least one performance metric, the selecting additional levels ending when at least one of a predetermined value of the at least one performance metric has been reached; and a maximum number of levels has been deactivated.

In some implementations of the present technology, the method further includes monitoring the at least one performance metric; detecting an improvement of the at least one performance metric; selecting at least one additional level of the plurality of quantization levels to be deactivated using the greedy search method; and deactivating the at least one additional level.

In some implementations of the present technology, the method further includes monitoring the at least one performance metric; detecting a degradation of the at least one performance metric; and selecting at least one previously deactivated level of the plurality of quantization levels to be reactivated using the greedy search method; and reactivating the at least one previously deactivated level.

In some implementations of the present technology, the greedy search method includes for each given level of the plurality of quantization levels: removing the given level to form a given reduced level set, and determining a given value of the at least one performance metric of a converted signal converted using the given reduced level set; and identifying one reduced level set of the given reduced level sets having the at least one performance metric closest to a pre-determined metric value, the at least one level to be deactivated selected being the given level removed to form the one reduced level set.

In some implementations of the present technology, the determining the given value of the at least one performance metric comprises receiving information that has undergone adaptive signal processing.

In some implementations of the present technology, the ADC is utilized to digitize a received waveform for a digital communication link and the at least one performance metric is a bit error rate (BER) of the digital communication link.

In some implementations of the present technology, the ADC is utilized to digitize a received waveform for a digital communication link; data transmitted by the digital communication link is protected by an error control code (ECC); and the at least one performance metric is determined at least in part based on information from an ECC decoder.

In some implementations of the present technology, the ADC is utilized to digitized a received waveform for a digital communication link; the received waveform is pulse amplitude modulated with noise and interference; and the at least one performance metric is determined at least in part from an eye-diagram of a converted signal converted with the subset of the plurality of quantization levels.

In some implementations of the present technology, the plurality of quantization levels are applied using a plurality of comparators; and the deactivating the at least one level is performed by turning off a corresponding one of the plurality of comparators.

In some implementations of the present technology, the ADC is adapted for performing an n-bit analog to digital conversion; the ADC includes 1-bit folding architecture; and the subset of the plurality of quantization levels for analog-to-digital signal conversion is adapted for performing a (n−1)-bit analog to digital conversion.

In some implementations of the present technology, further including using, for each one of a plurality of time-interleaved converter modules, a subset of a corresponding plurality of quantization levels, the subset of the corresponding plurality of quantization levels for at least one of the plurality of time-interleaved converter modules being different from the subset of the corresponding plurality of quantization levels for at least one other of the plurality of time-interleaved converter modules.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

Embodiments of the present disclosure will be described by way of example only, with reference to the accompanying drawings.

Like numerals represent like features on the various drawings. It should also be noted that, unless otherwise explicitly specified herein, the drawings are not to scale.

DETAILED DESCRIPTION

Various aspects of the present disclosure generally address one or more of the problems of utilizing a single analog-to-digital converter based receiving system solution for short reach, medium reach, and long reach communication channels while maintaining advantageous power consumption. Digital receiving systems also generally have reduced design times and reduced circuit areas, both of which can lead to reduced cost.

In applications where the receiving system receives links ranging from short reach communication channels (SR, 5 dB+ loss) to LR channels, however, a purely ADC-based solution is often not optimal. Each extra bit of resolution requires at least 2 times more power and ADCs are typically used in wireline communication which require a resolution of 6 bits or above. Further, the resolution is dependent on the channel loss characteristics, high loss channels requiring higher resolution so that the quantization does not affect the equalization. This is especially true as the industry moves from 2 level pulse-amplitude modulation (PAM-2) to 4 level pulse-amplitude modulation (PAM-4) in order to increase data rate while maintaining a compensable loss at Nyquist frequency. For short reach communication channels, an ADC-based receiver will generally consume much more power than necessary for the loss over these channels, especially in receiver systems that are designed to also receive high loss channels.

In order to maintain the analog-to-digital conversion benefits for the MR and LR communication channels without unnecessary power loss in the SR, it has also been proposed to build multiple solutions into a same receiver. While this may overcome some of the issues outlined above, having different solutions for SR and LR in a single receiver introduces design and space difficulties, as well as additional cost.

By using a greedy search method to select quantization levels to be deactivated or removed in the analog-to-digital converter, power usage in the receiver is scaled with channel loss. This thus allows a single ADC-based receiver to be implemented for systems spanning SR to LR communications. Further, through monitoring of the signal quality of a signal processed by the analog-to-digital converter, a balance between signal quality and power consumption can be maintained over time of operation.

Figure 1:
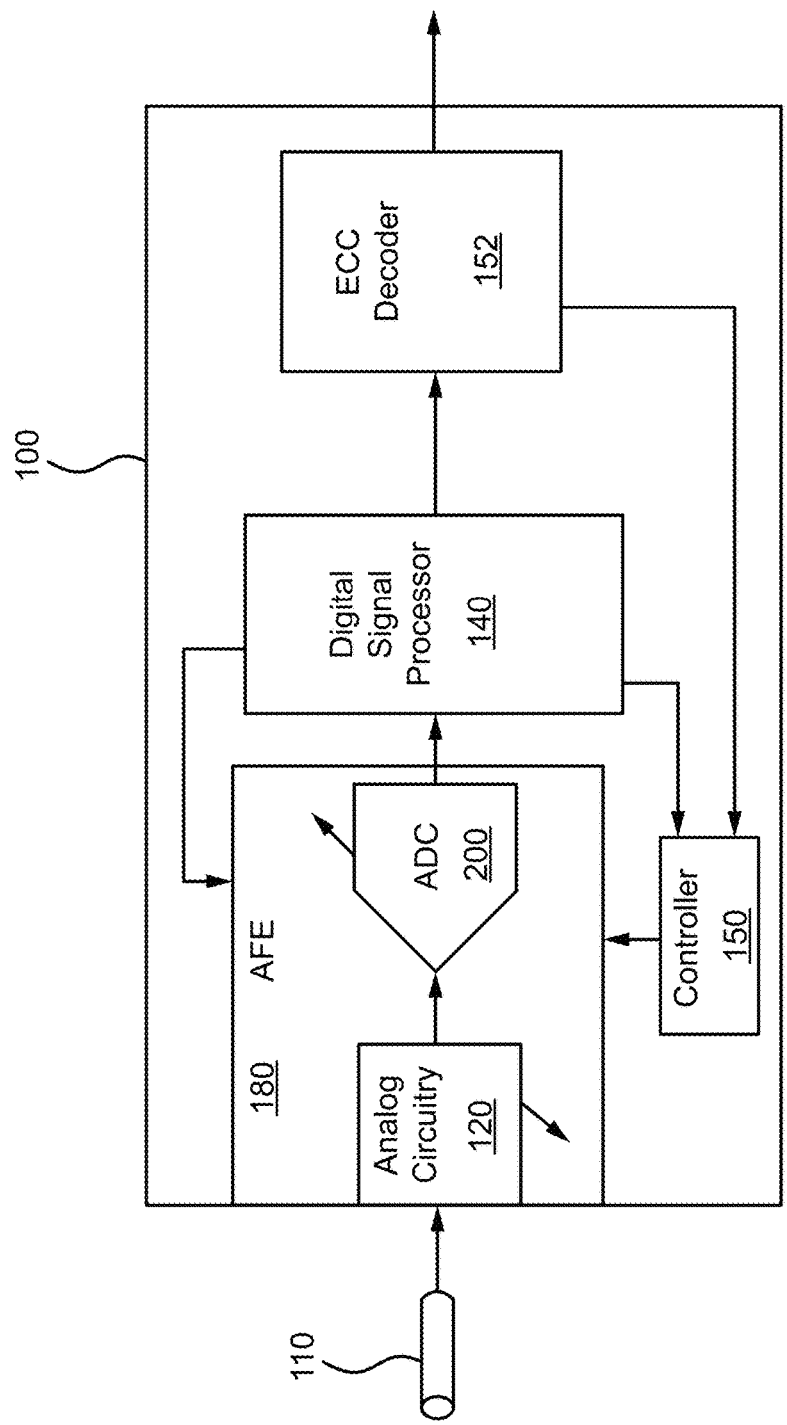
FIG. 1 is a schematic diagram of a receiver system using an analog-to-digital converter.

Referring now to the drawings, FIG. 1 illustrates a receiver system 100 which includes an analog-to-digital converter (ADC) 200, described in more detail below. For clarity of explanation, only components necessary to understanding the solutions disclosed herein will be described; remaining portions may depend on details of a specific implementation.

The receiver system 100 receives transmitted information, generally in the form of an analog waveform, from an analog link 110. The analog link 110 can be connected to any of short reach, medium reach, or long reach communication channels, or any extended network of wireline communications. The data from the link 110 is passed to an analog front end (AFE) 180 of the receiver 100, which includes analog circuitry 120 and an analog-to-digital converter 200. The initial analog circuitry 120 provides a controlled signal amplitude to remaining portions of the receiver system 100. The analog circuitry 120 generally includes gain, filters, and/or attenuators. In some implementations, the analog circuitry 120 could include automatic gain control (AGC) circuitry.

The receiver system 100 further includes the analog-to-digital converter 200 which is communicatively connected to the link 110 through the analog circuitry 120. The ADC 200 converts the incoming signal from the link 110 to a digital signal, such that the signal can undergo digital signal processing. Digital signal processing is generally an effective method of equalization and quality correction, especially useful for high channel loss signals. As will be explained in more detail below with respect to the ADC 200, scalable power usage made possible by the present solution allows low channel loss signals received by the ADC-based receiver 100 to also be processed by the ADC 200 and undergo digital signal processing, without the disadvantages discussed above.

Figure 2:
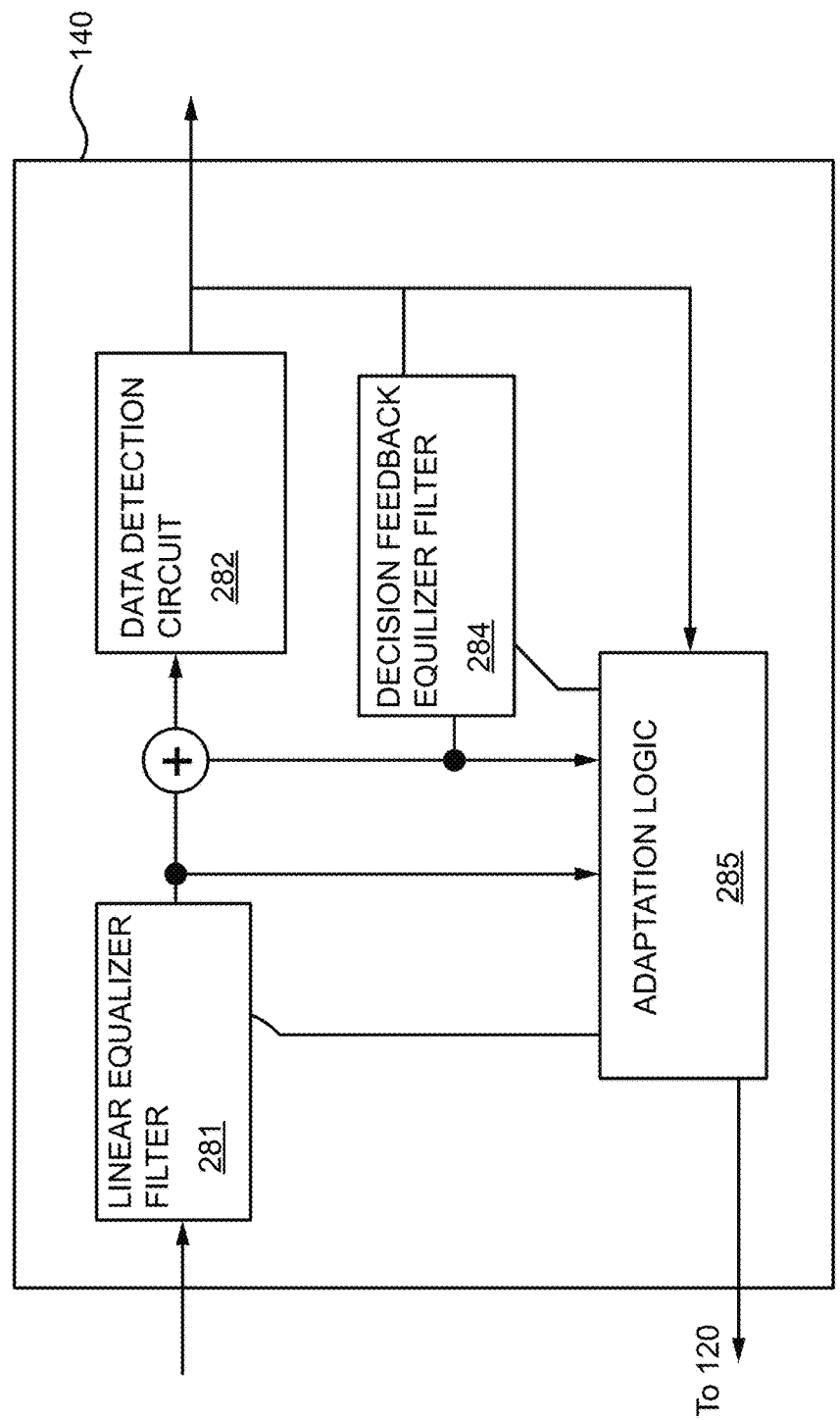
FIG. 2 is a schematic diagram of one possible implementation of a digital signal processor of the receiver system of FIG. 1.
Figure 3:
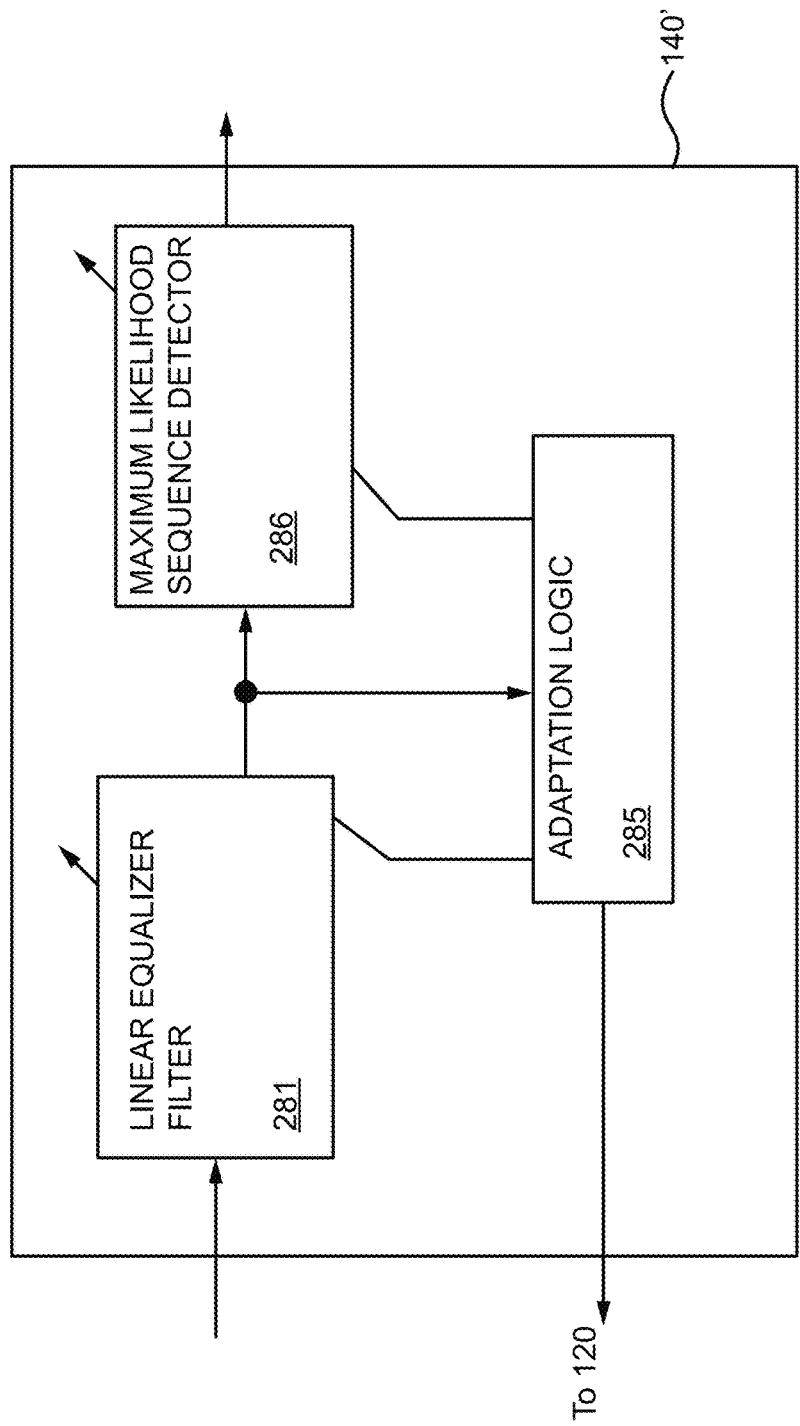
FIG. 3 is a schematic diagram of another possible implementation of the digital signal processor of the receiver system of FIG. 1.
Figure 4:
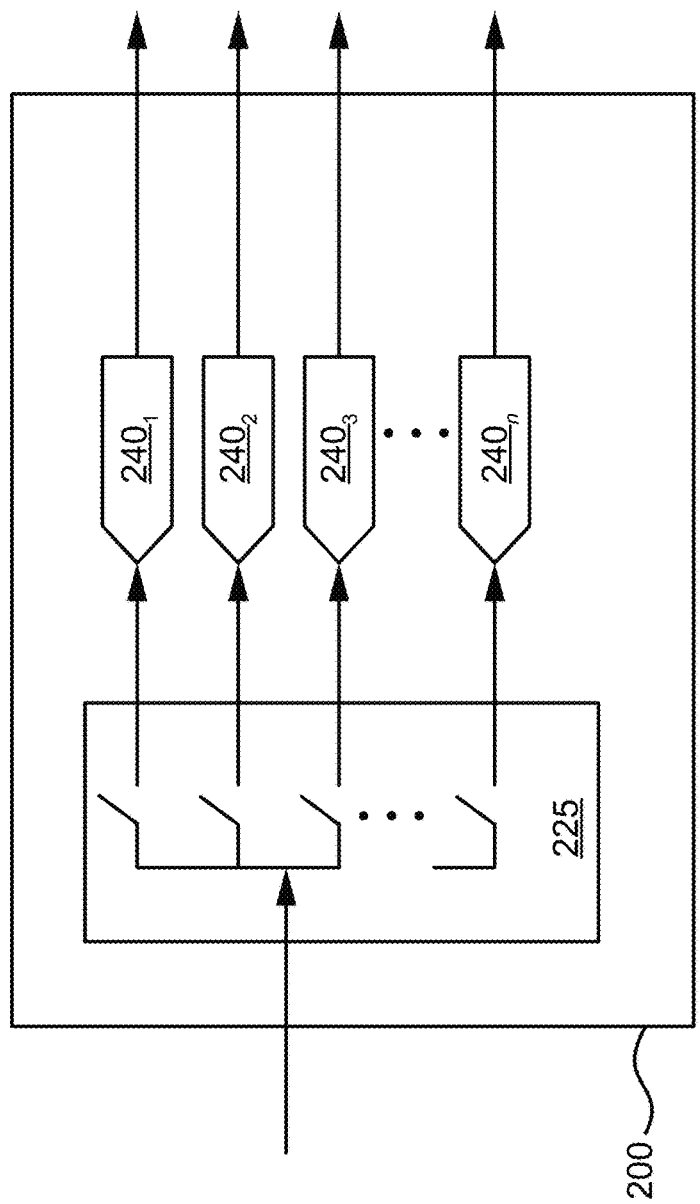
FIG. 4 is a schematic diagram of one non-limiting embodiment of the analog-to-digital converter of the receiver of FIG. 1, according to the present technology.
Figure 5:
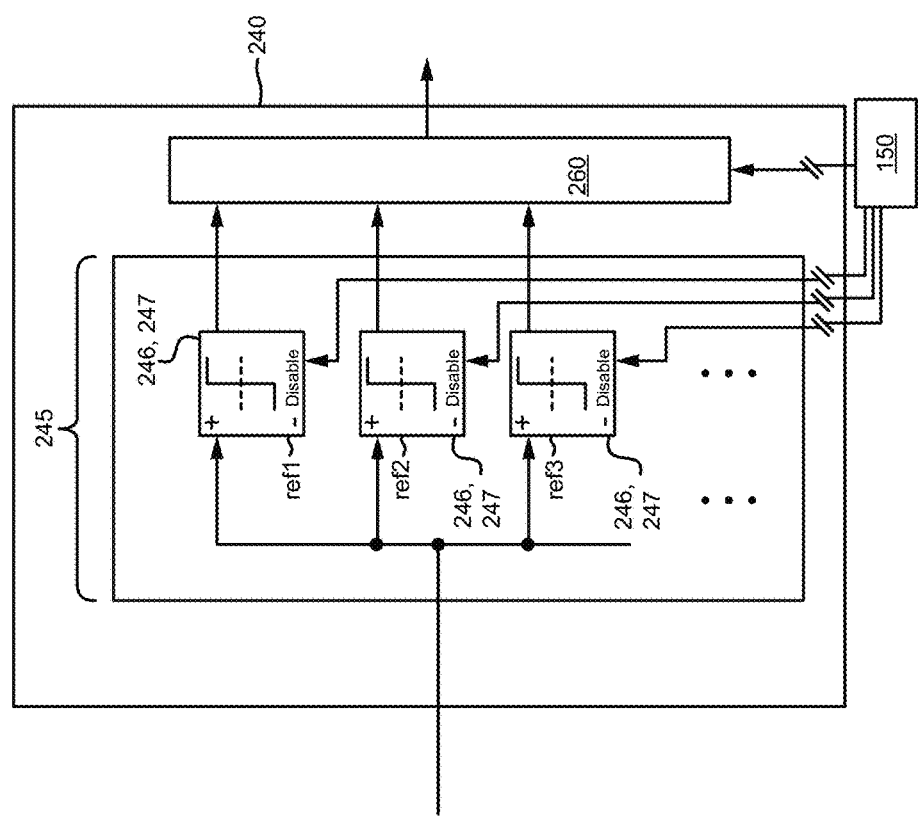
FIG. 5 is a schematic diagram of portions of a converter module of the analog-to-digital converter of FIG. 4.

With reference to FIGS. 1 to 3, a Digital Signal Processor (DSP) 140 for digital signal processing follows the ADC 200. The DSP 140 is generally a specialized microprocessor integrated onto a same chip or platform with the ADC 200. One non-limiting implementation of the DSP 140 is illustrated in FIG. 2. The DSP 140 includes a linear equalizer filter 281 and an adaptation logic 285. It is contemplated that the filter 281 could be implemented by a finite-impulse-response filter, which acts on the ADC output as an equalizer. The method for adaptation 285 is a least-mean-squared algorithm in some implementations, but it is also contemplated that well-known variants thereof may be implemented. Following the adaptation logic 285, information related to tuning of the analog circuit elements is sent back to the AFE 180. The tuning information can include, but is not limited to: gain settings, offset, and timing clock edge location. The DSP 140 further includes a data detection circuit 282 and a decision-feedback-filter 284. In FIG. 3, another non-limiting embodiment of a DSP 140' is illustrated. In the embodiment of the DSP 140', a maximum likelihood sequence detector 286 is utilized. Nonlinear signal detection and correction may also be included in either or both the DSP 140 and the DSP 140'. The particular implementation of the DSP 140, 140' is not limited by the present technology, and the functioning of the DSP 140, 140' in the receiver system 100 will readily be understood and need not be described in detail further.

The ADC 200 is also connected to a controller 150, which manages operation of the ADC 200, as well as any other components to which the controller 150 may be communicatively connected. In the illustrated embodiment, both of the ADC 200 and DSP 140 are linked to the controller 150, but that may not be the case in different embodiments. The controller 150 is not limited in its implementation and may be a separate entity from the ADC-based receiver system 100. In some cases, the controller 150 may be implemented as a stand-alone computing system with control software communicatively connected to the ADC 200. In other implementations, the controller 150 may be implemented by a microprocessor (not shown) integrated on the same chip as the ADC 200, or by integrated digital logic.

The n-bit analog-to-digital converter (ADC) 200, according to one non-limiting embodiment of the present technology, is illustrated in FIGS. 4 to 8 and will now be described in greater detail. As mentioned above, the ADC 200 is adapted for digitizing a received waveform, received from the link 110 and forwarded to the ADC 200 through the analog circuitry 120. The ADC 200 is adapted to receive signals of origins spanning from SR to LR communication channels.

In the present implementation, the ADC 200 receives the signal to be converted through a continuous time linear equalization (CTLE) filter 220 included in the analog circuitry 120. The CTLE filter 220 accentuates signal content at the Nyquist frequency relative the signal content at low frequencies, generally amplifying signal content around the Nyquist frequency and/or attenuating signal content at low frequencies. It is contemplated, however, that the ADC 200 according to the present technology may be operated without the CTLE filter 220 in the receiver system 100, depending on the specific implementation.

The ADC 200 includes at least one converter module 240 communicatively connected to the link 110 (through the analog circuitry 120). As is illustrated for the present embodiment in FIGS. 4 and 8, the ADC 200 includes a time-interleaved sampler 225, also referred to as a time-interleaver 225 and a plurality of converter modules 240.

Both the time-interleaver 225 and the group of converter modules 240 are managed by the controller 150 The time-interleaver 225 has a number N paths which connect to N converter modules 240, such that the converter modules 240 are time-interleaved.

Within the scope of the present technology, the number N of interleaver paths and converter modules 240 can vary widely. In some implementations, N could be one and no time-interleaving would take place. As can be seen in the detailed view of the present embodiment in FIG. 8, the ADC 200 in this instance includes eight time-interleaved converter modules 240 connected to the time-interleaver 225.

The ADC 200 digitizes the incoming signal received from the analog circuitry 120 using a plurality of quantization levels 247, as is generally the case with analog-to-digital converters. In the present non-limiting embodiment, illustrated in FIG. 5, each converter module 240 is a full flash ADC and includes an array 245 of comparators 246, which is a set of voltage limits that act as threshold levels providing the quantization levels 247 for digitizing the signal. The outputs of each comparator 246 from the array 245 are then recombined by a logic block 260. In some non-limiting implementations, the logic block 260 may be implemented by a Wallace adder followed by a look-up table (LUT) based encoder. The programmable LUT maps the output of the adder to a digital value for every possible combination of comparator activation. Each comparator 246 of the array 245 is connected to the controller 150, such that the controller 150 selectively deactivates any one comparator 246, which will be described in more detail below. The controller 150 also re-configures the encoder of the block 260 to re-interpret the digital code depending on which comparators 246 are de-activated. For an n-bit ADC 200, the resolution of the encoder 260 output will be greater than or equal to n.

According to the present technology, the ADC 200, through the management provided by the controller 150, is adapted utilize a subset of the plurality of quantization levels 247 for analog-to-digital signal conversion. In the present embodiment, a subset of the comparators 246 are used to convert the signal received from the analog circuitry 120, such that some of the comparators 246 which can be deactivated with relatively moderate impact on the performance of the conversion can be individually turned off and power consumption can be decreased. In some implementations, as the converter modules 240 are time-interleaved, each one of the converter modules 240 could be independently controllable such that a different subset of the plurality of comparators 246 can be formed for each one of the converter modules 240. This could be useful, for example, to compensate for different efficiencies in each of the converter modules 240 introduced through manufacturing process variation and tolerances.

In different implementations of the ADC 200, the quantization levels 247 could be implemented in a different manner (i.e. without the use of the comparators 246), as will be explored below with reference to the method 300. Briefly stated, the present technology may be applied to an analog-to-digital converter of any type, inasmuch as it is possible to deactivate some of its quantization levels 247 while using a remaining subset of its quantization levels 247. In the case of an analog-to-digital converter implementing a multiple step conversion process, deactivating some quantization levels could by implemented by bypassing specific steps of the conversion. The manner in which this would be carried out would be specific to the implementation of the quantization levels 247 in a given ADC.

In the present embodiment, the subset of the quantization levels 247 of a given converter module 240 is formed by selecting at least one of the quantization levels 247, in this case the comparators 246, to be deactivated using a greedy search method based on at least one performance metric, and then deactivating, by the controller 150, the chosen level. A particular comparator 246 is deactivated by the controller 150 reducing the power consumption of the comparator 246 to a minimum (near zero). In some implementations, for example, where the comparator 246 is a dynamic comparator, the controller 150 could disable the clock signal to that comparator 246.

Based on a performance metric determined by at least the controller 150, the greedy search method can determine which quantization levels 247 can be removed with moderate effect on the conversion performance. The performance metric and the greedy search method will be described in more detail below with respect to methods for controlling the ADC 200.

Figure 6:
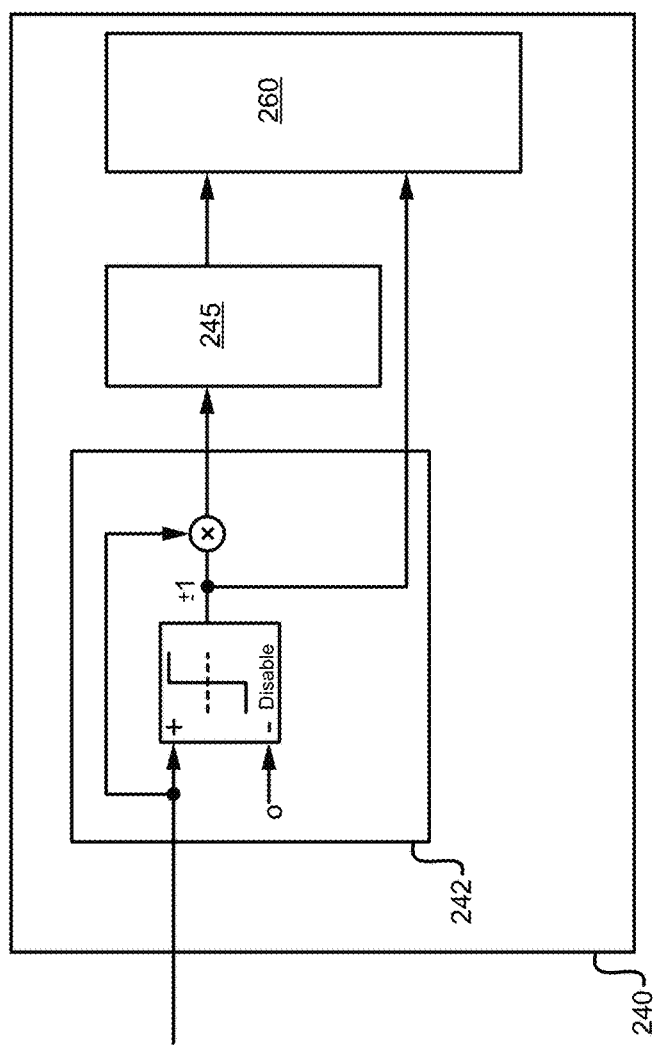
FIG. 6 is a schematic diagram of portions of the converter module of the analog-to-digital converter of FIG. 4.
Figure 8:
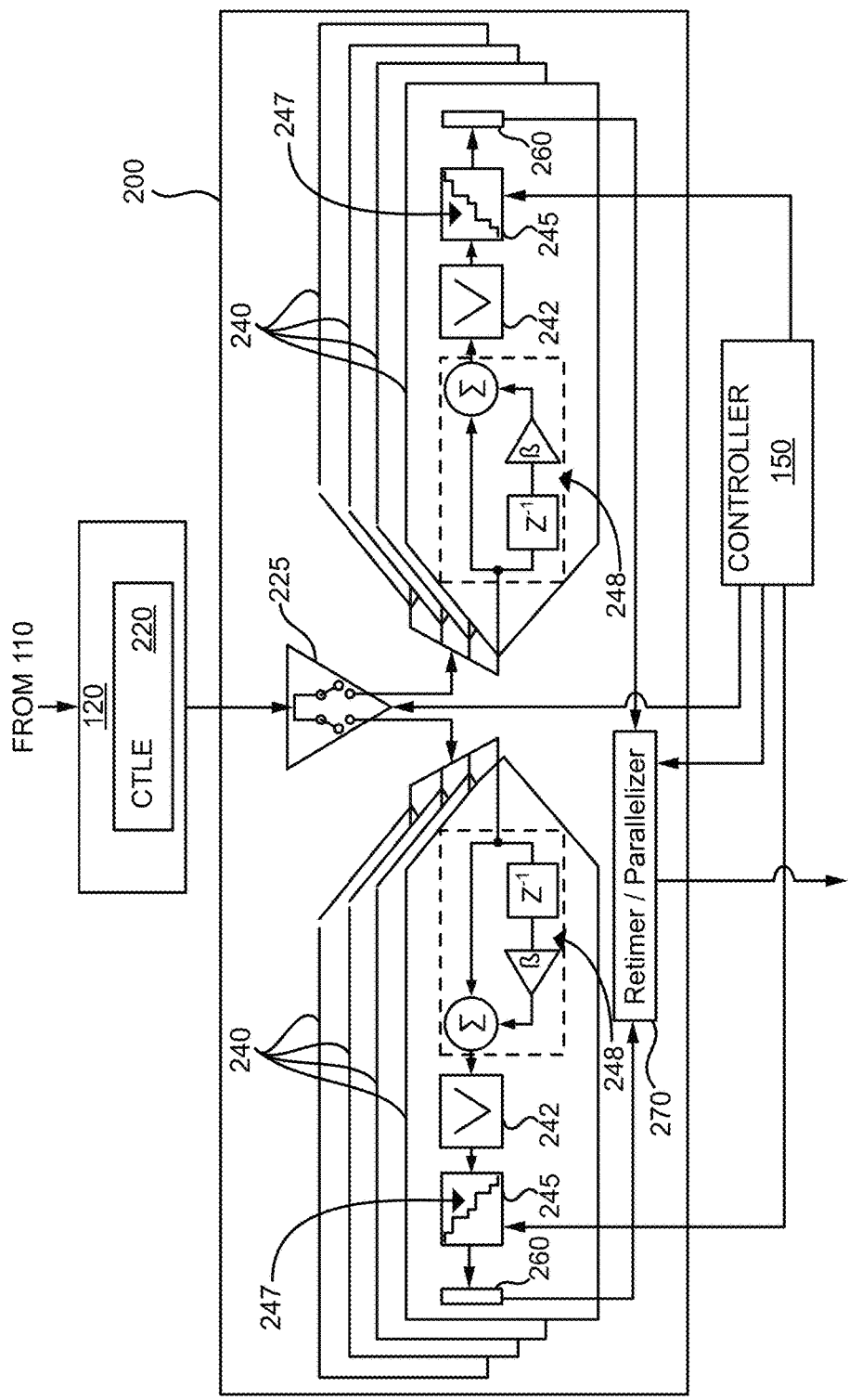
FIG. 8 is a schematic diagram illustrating the analog-to-digital converter of FIG. 4 in greater detail.

In the illustrated embodiment of the ADC 200, as shown in FIGS. 6 and 8, each converter module 240 includes a 1-bit folding stage 242. The 1-bit folding stage 242 rectifies the waveform received at the folding stage 242 by first comparing the waveform to a middle quantization level. The 1-bit folding architecture is effective for applications where the receiver system 100 is receiving electronically transmitted signals, where the received waveform amplitude probability distribution is generally symmetric. As the quantization levels 247 are symmetric about the middle level, the greedy search used to determine a level to be deactivated can be performed for half as many levels, and the comparators 246 are deactivated in pairs. Following the 1-bit folding stage 242, for the n-bit ADC, the comparator array 245 for each converter module 240 is an (n−1)-bit comparator array 245.

It should be noted that in the case of optical communication signals, asymmetric errors can arise, and implementations for use with optical communication lines will generally be provided without the 1-bit folding stage.

Figure 7:
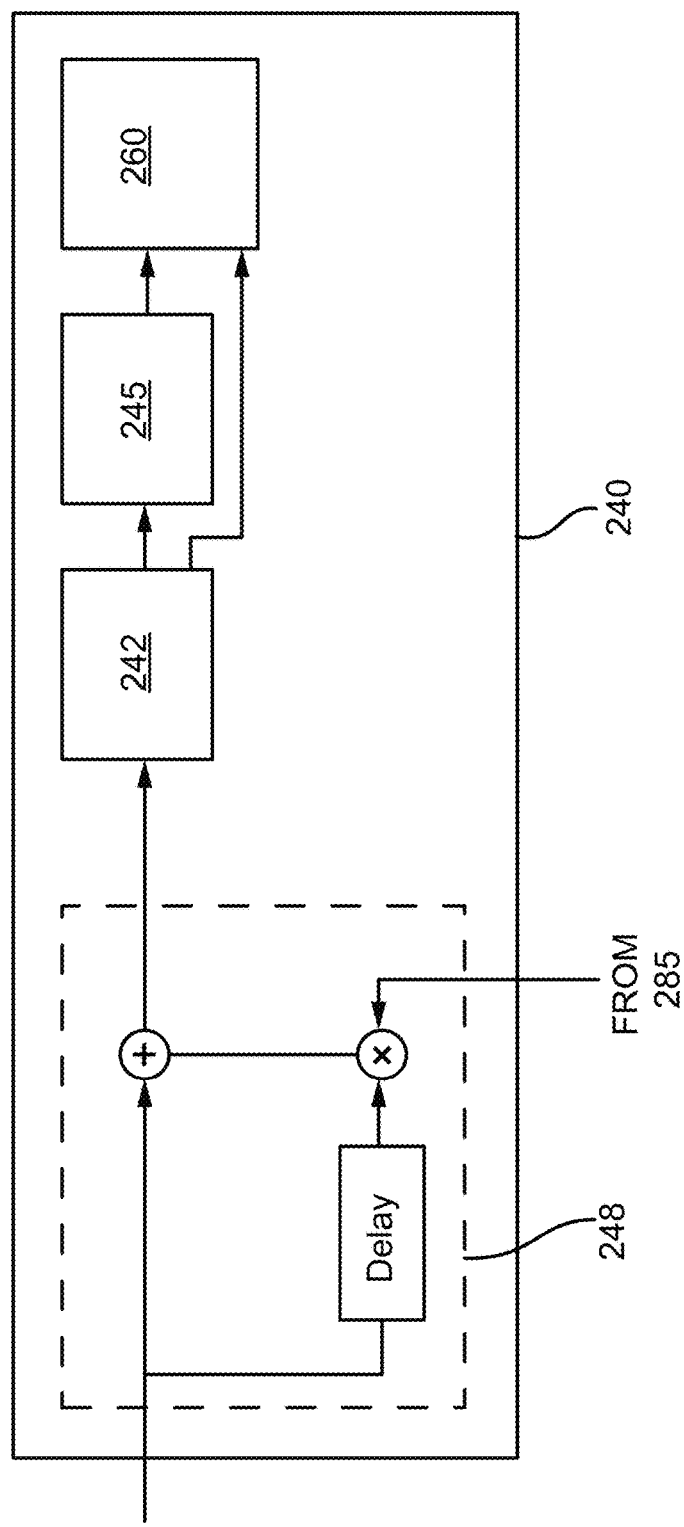
FIG. 7 is a schematic diagram of portions of the converter module of the analog-to-digital converter of FIG. 4.

In the present embodiment, illustrated in FIGS. 7 and 8, each converter module 240 further includes a 2-tap feed-forward equalization module 248 (FFE), sequentially before the 1-bit folding stage 244, for aiding in reducing intersymbol interference before quantization of the signal. As the converter modules 240 are time-interleaved, the delay caused the 2-tap FFE 248 is compensated at least in part by the fact the converter modules 240 are time-interleaved. It is contemplated that a different FFE arrangement could be employed. It is also contemplated that the FFE module 248 could be absent in some implementations.

In the present embodiment, each converter module 240 is connected to a retimer/parallelizer 270, for recombining the data having been converted to digital signals following the conversion using the comparators 246. The retimer realigns the data onto a single clock domain, while the parallelizer converts the eight parallel data outputs from the converter modules 240. It is contemplated that the retimer and/or parallelizer functions 270 could be separated from each other and/or from the ADC 200 in some implementations.

With reference to FIGS. 9 to 13, non-limiting embodiments of methods 300, 400 for controlling the ADC 200 will be described. The methods 300, 400 include a plurality of operations that may be executed in variable order, some of the operations possibly being executed concurrently, some of the operations being optional. In addition to the operations illustrated in the Figures and described below, the methods may include further operations not shown or described, depending on details of a given implementation.

As described above, the controller 150 generally controls and manages the ADC 200, and as such controls the methods 300, 400 described herebelow. It is contemplated that the methods 300, 400 could also be controlled by a separate computational system, such as by a computer communicatively connected to the ADC 200.

Further, while the methods 300, 400 are described below with respect to the ADC 200, it is contemplated that the methods 300, 400 could be used to manage a different embodiment of an analog-to-digital converter. For example, the methods 300, 400 could be used to manage a non-time-interleaved full-flash ADC, a folding-flash converter, or a pipeline converter which employs a multi-bit flash or folding-flash converter for quantization within one or more pipeline stages. The methods 300, 400 may involve an ADC capable of deactivating quantization levels such that the analog-to-digital conversion can be carried out over a restricted set of thresholds, in whatever manner in which they may be physically implemented.

Figure 9:
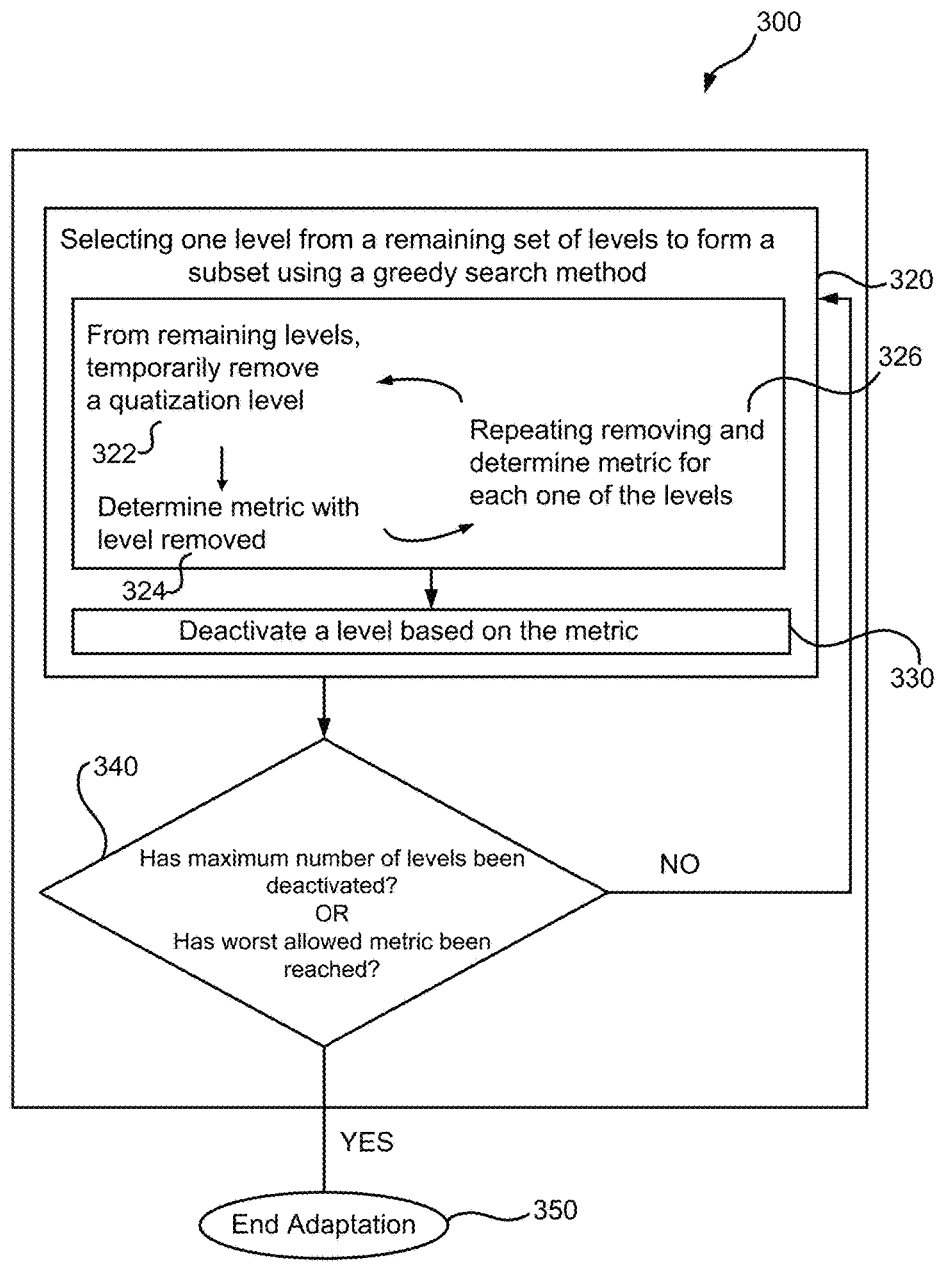
FIG. 9 is a flowchart of one non-limiting embodiment of a method of controlling the analog-to-digital converter of FIG. 4.
Figure 10:
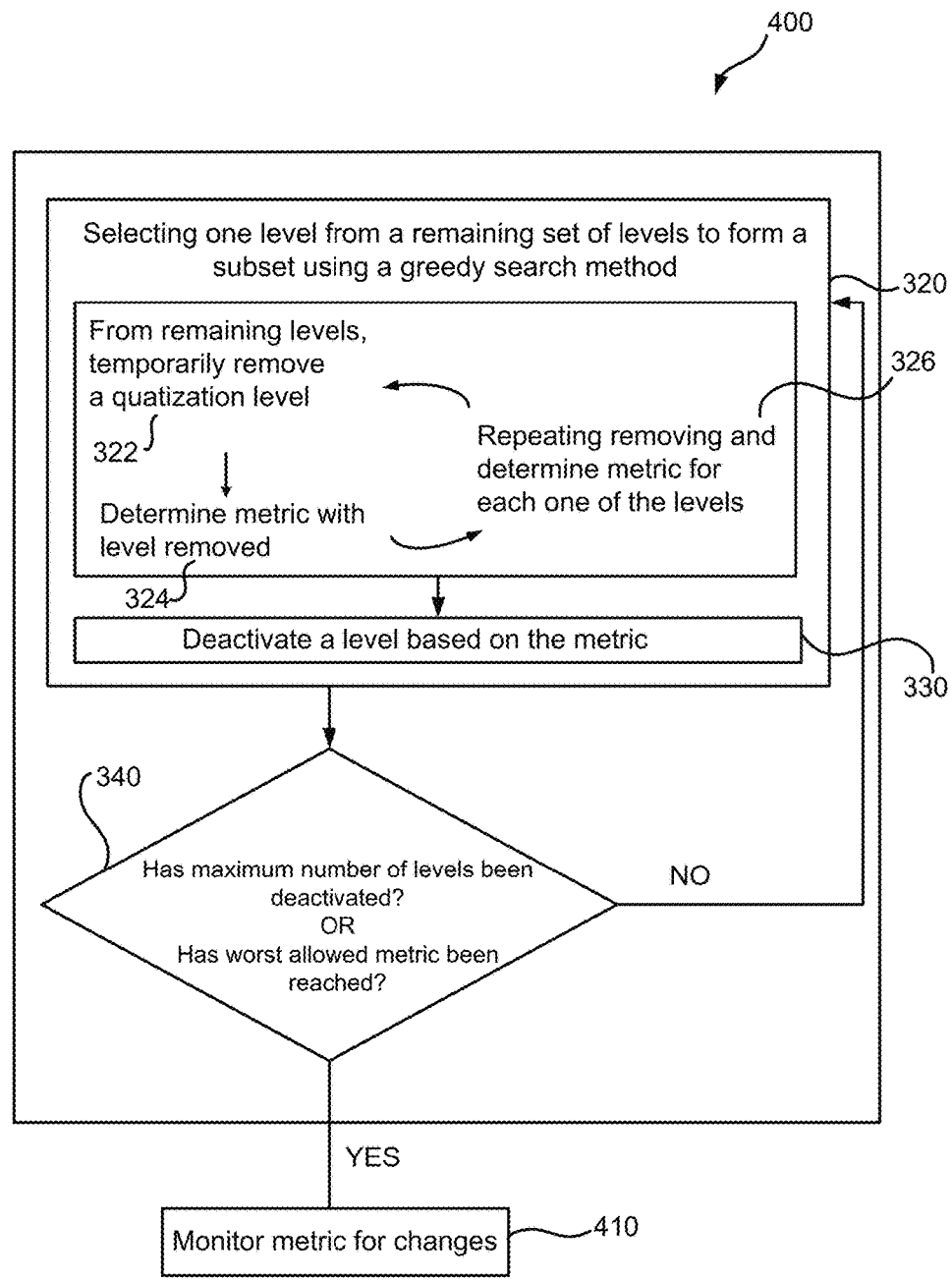
FIG. 10 is a flowchart of another non-limiting embodiment of a method of controlling the analog-to-digital converter of FIG. 4.

The method 300 for controlling the ADC 200 is one non-limiting embodiment of the present technology and is schematically illustrated in FIG. 9.

The method 300 controls the ADC 200 to use subset of the plurality of quantization levels for analog-to-digital signal conversion, as was mentioned above. In order to form the subset to be used, the method 300 begins at operation 320 with selecting one or more quantization levels to be deactivated by performing a greedy search, a computational process described in detail hereinbelow, based on one or more performance metrics.

The performance metric used to select levels to be deactivated is not especially limited. Generally, the controller 150 can determine any value related to the converted signal in order to quantify the quality of the signal that has been converted by the ADC 200. The available performance metrics in any given ADC 200 could include, but are not limited to: overall receiver bit-error-rate (BER), noise margin at a particular bit-error-rate, timing margin at a particular bit-error-rate, and the mean-squared-error of one or more digital signals within the receiver system 100, relative to their ideal value. In implementations where the communication link 110 is protected by an error control code (ECC), the bit-error-rate may be observed by a digital ECC decoder 152 (illustrated in FIG. 4). It is contemplated that the DSP 140, 140' could include the ECC decoder 152 in some implementations. In some implementations, a Reed-Solomon code for the ECC decoder 152 may be utilized to automatically provide a measure of the number of bit errors. In such an implementation, these bit errors may be counted by the controller 150 and translated into a BER for use as the ADC performance metric.

In some cases, the performance metric could be determined from information that has undergone adaptive signal processing, for example by the DSP 140, 140'. Such example implementations could include, but are not limited to, adaptive calibration of analog impairments, adaptive digital equalization, and adaptive maximum likelihood sequence estimation. In such an implementation, it should be noted that these elements will generally be readapted after removal of each candidate quantization level 247, and the performance metric will then be observed after convergence of the adaptive signal processing.

Where the received waveform is pulse amplitude modulated with noise and interference, the performance metric can be determined at least in part from information obtained from an on-chip eye-monitor circuit. Specifically, the noise margin of the received signal after digital signal processing by the DSP 140, 140' may be observed by considering how the communication bit error rate varies with changes in the decision threshold(s) applied in recovering the data. Similarly, timing margin may be observed by considering how the BER varies with changes in the sampling time of the received waveform.

The greedy search method, as applied to selecting quantization levels to be deactivated, is generally as follows. For each given level of the plurality of quantization levels, the level is temporarily removed to form a given reduced level set, at sub-operation 322. The value of the performance metric, based on a signal converted using this temporary reduced level set, is then determined at sub-operation 324. This temporary removal and determining the value of the performance metric is repeated, at sub-operation 326, for each one of the quantization levels (each one of the temporarily deactivated levels being reactivated before deactivating the subsequent one).

Having tested removing each of the of quantization levels, one reduced level set is then identified as the subset having produced the performance metric closest to a pre-determined metric value, the pre-determined metric value generally being the optimum possible value for the performance metric. Generally, the temporary reduced level set which produces the minimum or maximum value of the performance metric is chosen, depending on whether the performance metric is optimally minimized or maximized. For example, where the BER is used at the performance metric, the reduced level set which produces the minimum BER is chosen. The quantization level which was removed to create the identified temporary reduced level set is then deactivated at operation 330.

The method 300 then continues at operation 340, where it is determined if the method 300 has generally attained a predetermined objective, in which case the method 300 ends at operation 350, or if further quantization levels can be removed. As the solution of the present technology is aimed at minimizing power consumption, the method 300 aims at deactivating as many levels as possible. As a constraint, however, a signal with a minimum quality is still desired; generally, removing quantization levels tends to reduce the accuracy and quality of the converted signal. This is illustrated at least in part in FIG. 13, which is described in more detail below.

Thus at operation 340, the method 300 verifies if the performance metric has reached a predetermined value (for example, a maximum allowable BER limit), or if a predetermined number of maximum levels has already been deactivated. If neither limit has been reached, the method 300 returns to operation 320, and the greedy search begins again, this time with the previously reduced set as the set of quantization levels being interrogated. In this way, the number of active quantization levels is reduced by one by each cycle through the method 300.

Once either the limit on the performance metric or the minimum number of quantization levels has been reached, the method 300 ends at operation 350, and the ADC-based receiver 100 generally continues to operate with the reduced set of quantization levels (and at reduced power consumption). In some cases, the reduction of the resolution of the output of the ADC 200 applied at the digital signal processing in the DSP 140 may result in additional power savings for the ADC-based receiver system 100.

Figure 12:
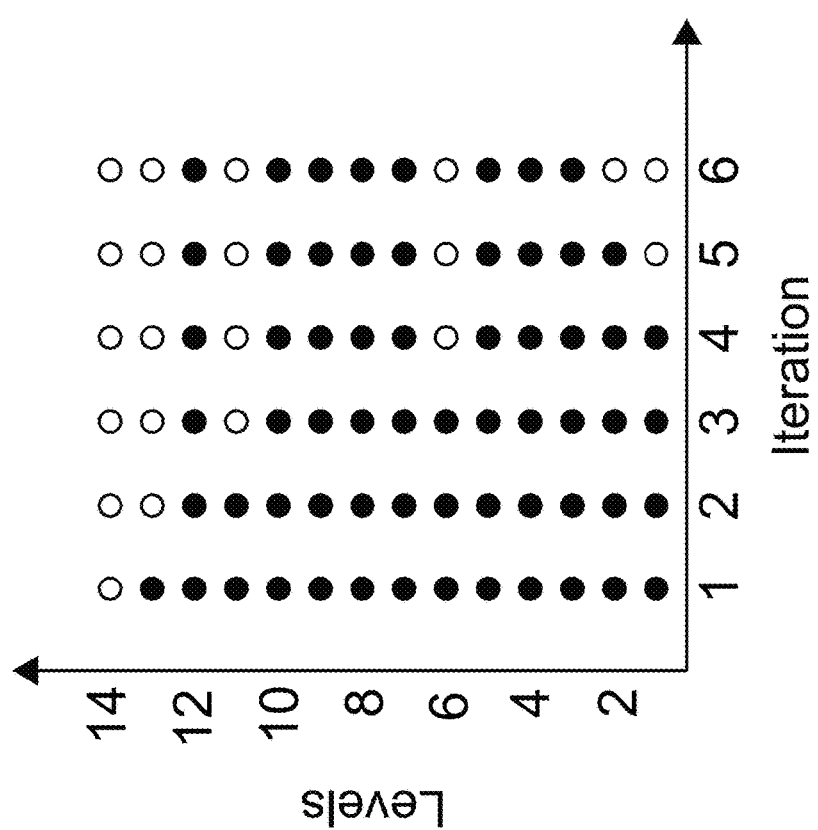
FIG. 12 is a schematic representation of quantization level deactivation in one example implementation of the method of FIG. 9.
Figure 13:
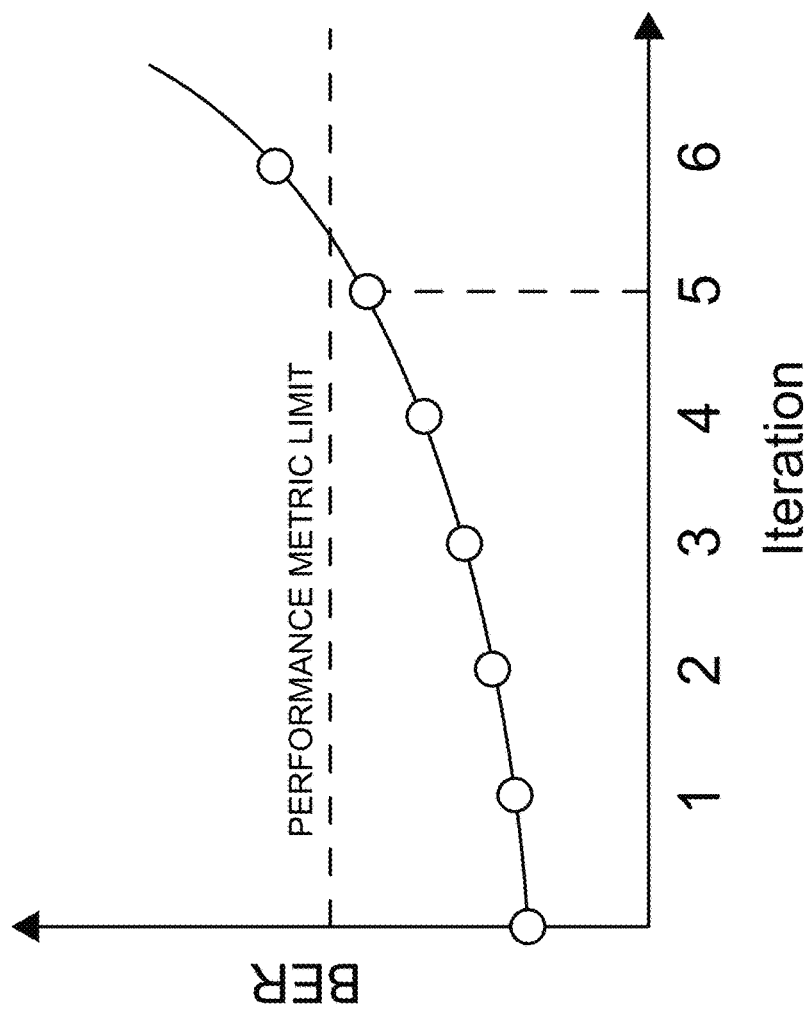
FIG. 13 is a plot illustrating bit-error-rate changes during the example implementation of FIG. 12.

One non-limiting example of an implementation of the method 300 is illustrated in FIGS. 12 and 13. FIG. 12 illustrates a series of six iterations of the greedy search operations to select quantization levels 247 to be removed. In the Figure, black solid circles indicate activated levels, while open circles indicate levels that have been deactivated. For instance, during step 1, level 14 is chosen for removal through greedy search. In each subsequent iteration 2-6, one additional level was then chosen for deactivation.

As can be seen in the plot in FIG. 13 of bit-error-rate (BER) over each of the iterations illustrated in FIG. 12, the levels that can be deactivated while still meeting BER target are 1, 6, 11, 13 & 14. At the sixth iteration, the BER passes the allowed or target threshold, and level 2 that had been selected to be deactivated will not be deactivated. Having met the limit on the performance metric, the method 300 will finish at operation 350. In this example, thus, the ADC 200 has been able to reduce its power consumption by deactivating five of the fourteen quantization levels, while maintaining a target BER value.

It should be noted that by using the method as described above, greedy-style searches may sometimes result in local optimization rather than global optimization, in which case the optimal reduced set of quantization levels may not be determined. A brute force search of every possible solution to find the optimal set, each time a new signal is received at the receiving system 100, a new reduced level set being desired, would however require an excessive number of trials. For example, in order to reduce a 4-bit flash ADC to 3-bits of resolution by deactivating 8 of 15 comparators would require 6,435 trials. Regardless, using the method described above to select levels to be deactivated, even in the case of a local optimization, can still be provide power savings.

While a particular channel may be stable over time, it is often the case that environmental or systems changes may induce improvements or degradations of the incoming signal from the link 110. These improvements and degradations will generally be seen in changes in performance metrics of the converted signal. The method 400 for controlling the ADC 200 is another non-limiting embodiment of the present technology, schematically illustrated in FIGS. 10 and 11, where the controller 150 continues the method in order to maintain sufficient quality in the performance while maintaining maximum power savings.

In an implementation of the method 400, the operations and sub-operations 320 through 340 are identical to the operations with the same numerals in method 300 as described above, and will not be described again here. Rather than terminating once a subset of quantization levels has been formed and is being used, as in operations 350 of the method 300, the method 400 continues at operations 410 by monitoring the performance metric for changes.

Figure 11:
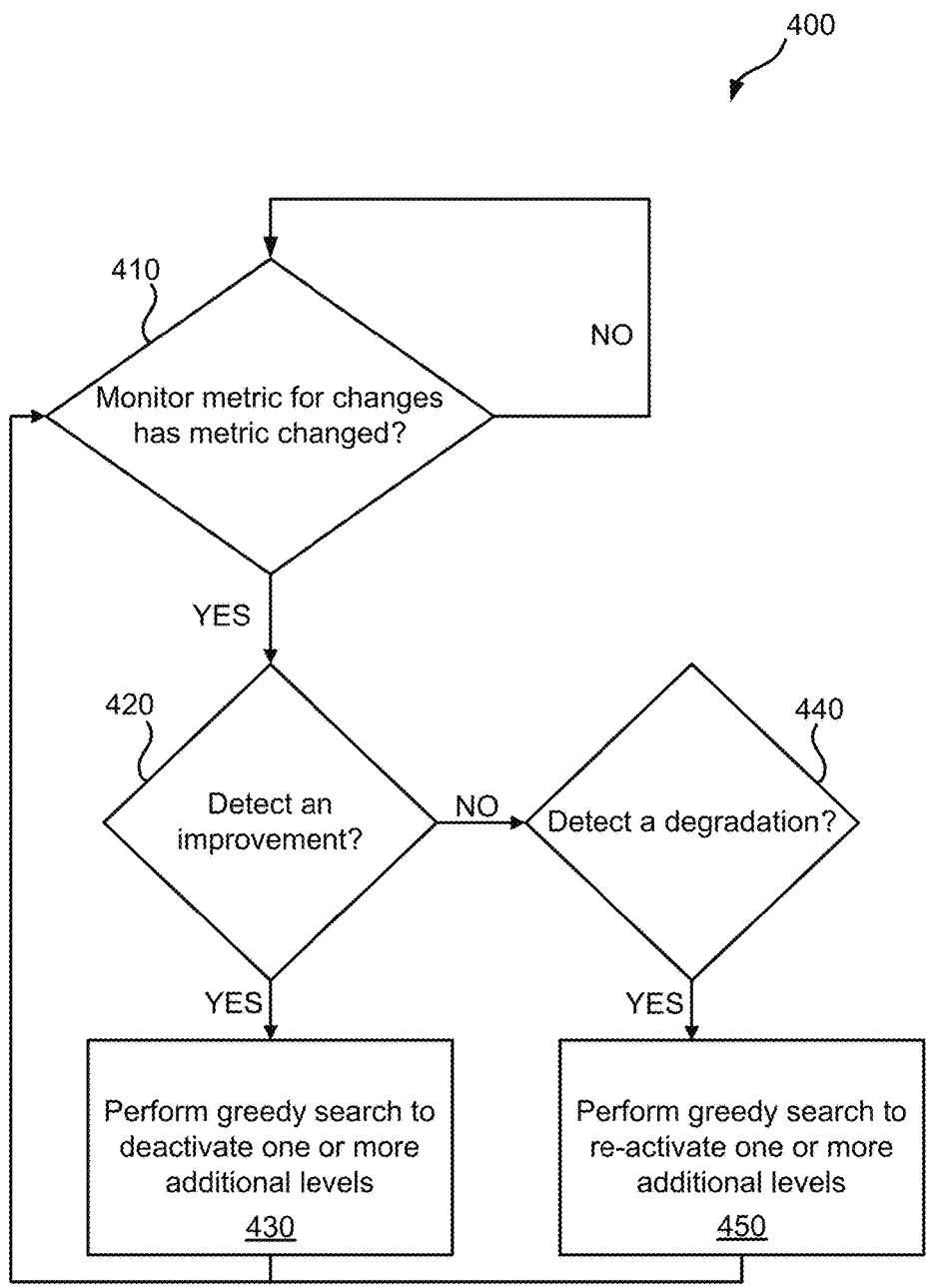
FIG. 11 is a flowchart detailing a portion of the method of FIG. 10.

As is illustrated in FIG. 11, if it is determined at operation 410 that there has been a change in the value of the performance metric, the method 400 continues by detecting if there has been an improvement in the performance metric at operation 420. If there has been an improvement, the method 400 continues, at operation 430, with the greedy search method, including sub-operations 320, 330, and 340, in order to select and deactivate one or more additional quantization levels. In this way, when the signal improves, the method 400 can reduce power usage by the ADC 200.

If no improvement is detected at operation 420, the method 400 then continues to operation 440, where the method 400 detects if there has been a degradation in the performance metric. If there has been a degradation, the method 400 continues, at operation 450, with the greedy search method, including sub-operations 320, 330, and 340, in order to select one or more of the previously deactivated quantization levels to be reactivated. In this way, when the signal degrades, the method 400 can reintroduce levels to maintain a minimum quality of the converted signal. It is contemplated that the method 400 could reactivate all the quantization levels at operation 450 and begin the greedy search anew from the full set of possible quantization levels. In some cases, the scale of the degradation in the value of the performance metric may determine if only some or all of the quantization levels are to be reintroduced.

It is contemplated that the operations 420 and 440 of the method 400 could be performed in a different order than that described above.

Various embodiments of the apparatuses and methods as disclosed herein may be envisioned. One such embodiment could include grouping of quantization levels 247 together such that entire groups of quantization levels 247 are deactivated together. While the architecture employing the 1-bit folding stage 242 causes the deactivation of two quantization levels 247 at a time, this could be extended to groups of more than two quantization levels. This may be especially application in certain implementations of ADC architectures, such as multi-bit-per-stage pipelined converters.

Those of ordinary skill in the art will realize that the description of the analog to digital converter and the method of controlling the ADC are illustrative only and are not intended to be in any way limiting. Other embodiments will readily suggest themselves to such persons with ordinary skill in the art having the benefit of the present disclosure.

Furthermore, the disclosed device and methods may be customized to offer valuable solutions to existing needs and problems related to analog to digital signal conversion. In the interest of clarity, not all of the routine features of the implementations of the device and methods are shown and described. In particular, combinations of features are not limited to those presented in the foregoing description as combinations of elements listed in the appended claims form an integral part of the present disclosure.

It will, of course, be appreciated that in the development of any such actual implementation of the device and methods, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of designing and utilizing analog to digital converters having the benefit of the present disclosure.

In accordance with the present disclosure, the components, process operations, and/or data structures described herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used. Where a method including a series of operations is implemented by a computer, a processor operatively connected to a memory, or a machine, those operations may be stored as a series of instructions readable by the machine, processor or computer, and may be stored on a non-transitory, tangible medium.

Systems and modules described herein may include software, firmware, hardware, or any combination(s) of software, firmware, or hardware suitable for the purposes described herein. Software and other modules may be executed by a processor and reside on a memory of servers, workstations, personal computers, personal computing devices, smart phones, computerized tablets, personal digital assistants, and other devices suitable for the purposes described herein. Software and other modules may be accessible via local memory, via a network, via a browser or other application or via other means suitable for the purposes described herein.

The present disclosure has been described in the foregoing specification by means of non-restrictive illustrative embodiments provided as examples. These illustrative embodiments may be modified at will. The scope of the claims should not be limited by the embodiments set forth in the examples, but should be given the broadest interpretation consistent with the description as a whole.

What is claimed is:

1. An analog-to-digital converter (ADC) for digitizing a received waveform for a digital communication link, comprising:
   at least one converter module communicatively connected to at least one link, the at least one converter module comprising a plurality of quantization levels, the at least one converter module being adapted for utilizing a subset of the plurality of quantization levels for analog-to-digital signal conversion, the subset being formed by:
      selecting at least one level of the plurality of quantization levels to be deactivated, the at least one level being selected using a greedy search method based on at least one performance metric; and
      deactivating the at least one level,
      the greedy search method comprising:
         testing a plurality of different reduced level sets, and
         determining a value of the at least one performance metric for each one of the plurality of different reduced level sets.

2. The ADC of claim 1, wherein:
   the ADC is a full-flash ADC;
   the plurality of quantization levels are applied using a plurality of comparators; and
   the deactivating the at least one level is performed by turning off a corresponding one of the plurality of comparators.

3. The ADC of claim 1, further comprising:
   at least one time interleaver; and wherein:
   the ADC is an n-bit ADC; and
   the at least one converter module comprises a plurality of time interleaved converter modules operatively connected to the at least one time interleaver, each one of the converter modules comprising:
      a 1-bit folding stage; and
      an (n−1)-bit comparator array comprising a plurality of comparators, the plurality of comparators adapted for applying the plurality of quantization levels to the at least one signal,
   each one of the converter modules being adapted for utilizing a subset of the plurality of comparators corresponding to the subset of the plurality of quantization levels.

4. The n-bit ADC of claim 3, wherein each one of the converter modules is controllable such that a different subset of the plurality of comparators can be formed for each one of the plurality of converter modules.

5. The n-bit ADC of claim 3, wherein each one of the converter modules further comprises a 2-tap forward feed equalizer connected between the at least one time interleaver and the 1-bit folding stage.

6. The ADC of claim 1, wherein the at least one converter module is adapted to receive signals from any one of a short reach (SR) link, a medium reach (MR) link, and a long reach (LR) link.

7. A method for controlling an analog-to-digital converter (ADC), the ADC having a plurality of quantization levels, the method comprising:
   using a subset of the plurality of quantization levels for analog-to-digital signal conversion, the subset being formed by:
      selecting at least one level of the plurality of quantization levels to be deactivated, the at least one level being selected using a greedy search method based on at least one performance metric; and
      deactivating the at least one level,
      the greedy search method comprising:
         testing a plurality of different reduced level sets, and
         determining a value of the at least one performance metric for each one of the plurality of different reduced level sets.

8. The method of claim 7, wherein:
   the deactivating the at least one level is deactivating a first level; and
   the subset is further formed by:
      selecting a second level of the plurality of quantization levels to be deactivated, the second level being selected using the greedy search method based on the at least one performance metric, and
      deactivating the second level, the first level remaining deactivated.

9. The method of claim 8, wherein the subset is further formed by:
   successively selecting additional levels of the plurality of quantization levels to be deactivated using the greedy search method based on the at least one performance metric, the selecting additional levels ending when at least one of:
      a predetermined value of the at least one performance metric has been reached; and
      a maximum number of levels has been deactivated.

10. The method of claim 7, further comprising:
    monitoring the at least one performance metric;
    detecting an improvement of the at least one performance metric;
    selecting at least one additional level of the plurality of quantization levels to be deactivated using the greedy search method; and
    deactivating the at least one additional level.

11. The method of claim 7, further comprising:
    monitoring the at least one performance metric;
    detecting a degradation of the at least one performance metric; and
    selecting at least one previously deactivated level of the plurality of quantization levels to be reactivated using the greedy search method; and
    reactivating the at least one previously deactivated level.

12. The method of claim 7, wherein:
    the testing a plurality of different reduced level sets and determining a value of the at least one performance metric for each one of the plurality of different reduced level sets comprises:
       for each given level of the plurality of quantization levels:

removing the given level to form a given reduced level set, and determining a given value of the at least one performance metric of a converted signal converted using the given reduced level set; and the greedy search method further comprises:

identifying one reduced level set of the given reduced level sets having the at least one performance metric closest to a pre-determined metric value, the at least one level to be deactivated selected being the given level removed to form the one reduced level set.

13. The method of claim 12, wherein the determining the given value of the at least one performance metric comprises receiving information that has undergone adaptive signal processing.

14. The method of claim 7, wherein:
the ADC is utilized to digitize a received waveform for a digital communication link; and
the at least one performance metric is a bit error rate (BER) of the digital communication link.

15. The method of claim 7, wherein:
the ADC is utilized to digitize a received waveform for a digital communication link;
data transmitted by the digital communication link is protected by an error control code (ECC); and
the at least one performance metric is determined at least in part based on information from an ECC decoder.

16. The method of claim 7, wherein:
the ADC is utilized to digitized a received waveform for a digital communication link;
the received waveform is pulse amplitude modulated with noise and interference; and
the at least one performance metric is determined at least in part from an eye-diagram of a converted signal converted with the subset of the plurality of quantization levels.

17. The method of claim 7, wherein:
the plurality of quantization levels are applied using a plurality of comparators; and
the deactivating the at least one level is performed by turning off a corresponding one of the plurality of comparators.

18. The method of claim 7, wherein:
the ADC is adapted for performing an n-bit analog to digital conversion;
the ADC includes 1-bit folding architecture; and
the subset of the plurality of quantization levels for analog-to-digital signal conversion is adapted for performing a (n−1)-bit analog to digital conversion.

19. The method of claim 7, further comprising using, for each one of a plurality of time-interleaved converter modules, a subset of a corresponding plurality of quantization levels, the subset of the corresponding plurality of quantization levels for at least one of the plurality of time-interleaved converter modules being different from the subset of the corresponding plurality of quantization levels for at least one other of the plurality of time-interleaved converter modules.

20. A method for controlling an analog-to-digital converter (ADC), the ADC having a plurality of quantization levels, the method comprising:

using a subset of the plurality of quantization levels for analog-to-digital signal conversion, the subset being formed by:

selecting at least one level of the plurality of quantization levels to be deactivated, the at least one level being selected using a greedy search method based on at least one performance metric; and deactivating the at least one level, the greedy search method comprising:

for each given level of the plurality of quantization levels:

removing the given level to form a given reduced level set, and determining a given value of the at least one performance metric of a converted signal converted using the given reduced level set; and identifying one reduced level set of the given reduced level sets having the at least one performance metric closest to a pre-determined metric value, the at least one level to be deactivated selected being the given level removed to form the one reduced level set.

* * * * *